(12) United States Patent
Yu et al.

(10) Patent No.: US 9,715,173 B2
(45) Date of Patent: Jul. 25, 2017

(54) ALIGNMENT EXPOSURE METHOD AND METHOD OF FABRICATING DISPLAY SUBSTRATE

(71) Applicants: BOE Technology Group Co., Ltd., Beijing (CN); Hefei BOE Optoelectronics Technology Co., Ltd., Anhui (CN)

(72) Inventors: Xuequan Yu, Beijing (CN); Bin Wu, Beijing (CN); Kun Li, Beijing (CN); Lizhi Ren, Beijing (CN); Wenjun Shen, Beijing (CN); Yadong Gao, Beijing (CN)

(73) Assignees: BOE Technology Group Co., Ltd., Beijing (CN); Hefei BOE Optoelectronics Technology Co., Ltd., Anhui (CN)

( * ) Notice: Subject to any disclaimer, the term of this patent is extended or adjusted under 35 U.S.C. 154(b) by 0 days.

(21) Appl. No.: 15/145,379

(22) Filed: May 3, 2016

(65) Prior Publication Data
US 2016/0334674 A1 Nov. 17, 2016

(30) Foreign Application Priority Data
May 15, 2015 (CN) .......................... 2015 1 0249494

(51) Int. Cl.
*G03F 9/00* (2006.01)
*G03F 7/00* (2006.01)
(Continued)

(52) U.S. Cl.
CPC ...... *G03F 7/0007* (2013.01); *G02F 1/133516* (2013.01); *G03F 7/22* (2013.01);
(Continued)

(58) Field of Classification Search
CPC . G03F 7/0007; G03F 1/42; G03F 7/22; G03F 7/70475; G03F 9/70; G03F 9/7084;
(Continued)

(56) References Cited

U.S. PATENT DOCUMENTS 4,814,830 A * 3/1989 Isohata ..................... G03F 7/20
355/53
6,583,854 B1 * 6/2003 Hazama .............. G03F 7/70475
355/53
(Continued)

FOREIGN PATENT DOCUMENTS

CN 1524202 A 8/2004
CN 101539690 A 9/2009
CN 101900933 A 12/2010

OTHER PUBLICATIONS

Jun. 28, 2016—(CN)—First Office Action Appn 201510249494.1 with English Tran.
(Continued)

*Primary Examiner* — John A McPherson
(74) *Attorney, Agent, or Firm* — Banner & Witcoff, Ltd.

(57) ABSTRACT

An alignment exposure method and a method for fabricating a display substrate are disclosed. The alignment exposure method includes a first alignment exposure process and a second alignment exposure process. Multiple groups of alignment marks are provided at an edge of at least one side of the substrate in the first alignment exposure process. At least one group of mark structures are provided at an edge of at least one side of a mask employed in the second alignment exposure process. In multiple mask alignment processes in the second alignment exposure process, each group of the at least one group of the mark structures of the mask are aligned with groups of the alignment marks at a corresponding side of the substrate group by group. The alignment exposure method is employed to realize align- (Continued)

ment exposure of a substrate with a size larger than a size of a mask.

20 Claims, 3 Drawing Sheets

(51) Int. Cl.
G03F 7/20 (2006.01)
G03F 7/22 (2006.01)
G02F 1/1335 (2006.01)
G03F 1/42 (2012.01)

(52) U.S. Cl.
CPC ........ *G03F 7/70475* (2013.01); *G03F 9/7084* (2013.01); *G02F 2001/133519* (2013.01); *G03F 1/42* (2013.01)

(58) Field of Classification Search
CPC . G03F 9/7003; G03F 9/7038; G02F 1/133516
USPC ....................................... 430/7, 321, 22, 394
See application file for complete search history.

(56) References Cited

U.S. PATENT DOCUMENTS

| 2001/0026894 | A1 | 10/2001 | Kim | |
| 2004/0021801 | A1* | 2/2004 | Tak | G03F 1/14 349/1 |
| 2007/0298329 | A1* | 12/2007 | Huang | G03F 9/7084 430/5 |

OTHER PUBLICATIONS

Dec. 8, 2016—(CN) Second Office Action Appn 201510249494.1 with English Tran.

* cited by examiner

ALIGNMENT EXPOSURE METHOD AND METHOD OF FABRICATING DISPLAY SUBSTRATE

This application claims priority to and the benefit of Chinese Patent Application No. 201510249494.1 filed on May 15, 2015, which application is incorporated herein in its entirety.

TECHNICAL FIELD

Embodiments of the present disclosure relate to an alignment exposure method and a method for fabricating a display substrate.

BACKGROUND

In a technical field of fabricating display panels, as the rapid development and constant improvement of TFT-LCD (thin film transistor liquid crystal display) technology, the size of a liquid crystal display panel increases constantly as well. The size of a display substrate such as a color filter substrate, as an important component in a liquid crystal display panel, increases accordingly. Therefore, main manufacturers of display panels need to establish a manufacturing line of a new generation, so as to produce color filter substrates with larger sizes. However, doing in this way involves high investment and high risk. Therefore, manufacturing a color filter substrate with a larger size by a current manufacturing line is becoming a research focus.

In a fabrication process of a color filter substrate, a plurality of exposures is conducted. Firstly, in order to make an opening portion of the color filter substrate, a black film layer is coated on a transparent substrate and an exposure is then performed, so as to form a black matrix structure; and then, film layers such as a blue film layer, a green film layer and a red film layer are coated in sequence, which are then exposed and developed to form blue pixels, green pixels and red pixels. And then, after a common electrode is formed on the black matrix structure, the blue pixels, the green pixels and the red pixels, a spacer material layer is coated as well, which is then exposed and developed to form post spacers. The exposure process employed to form the black matrix structure is called a primary exposure, and the exposure process employed to form pixel resin and post spacers is called a secondary exposure. In practice, in order to ensure accurateness of the plurality of exposures, a method as below is commonly employed: an alignment mark is formed respectively at edges of two opposite sides of the transparent substrate after the primary exposure process; and in the secondary exposure process, two mark holes at edges of two sides of a mask are aligned with the alignment marks at the transparent substrate, so as to make positions of the secondary exposure accurate, so that patterns on the mask can be precisely transferred to corresponding positions of the transparent substrate, and pixels as well as post spacers that are accurately arranged can be obtained.

SUMMARY

Embodiments of the present disclosure provide an alignment exposure method and a method for fabricating a display substrate, to perform the alignment and exposure for a substrate by a mask, under a case that the size of the mask is less than the size of the substrate.

At least one embodiment of the present disclosure provides an alignment exposure method, which includes a first alignment exposure process and a second alignment exposure process. In the first alignment exposure process, an edge of at least one side of a substrate is formed with a plurality of groups of alignment marks. The second alignment exposure process includes a plurality of mask alignment processes and a plurality of exposure processes, and an edge of at least one side of a mask employed in the second alignment exposure process is formed with at least one group of mark structures. A distance is provided between adjacent groups of the alignment marks at a same side of the substrate, with the distance being less than or equal to a width of an effective exposure area at a corresponding side of the mask; and in the plurality of mask alignment processes, each group of the at least one group of the mark structures of the mask are aligned with groups of the alignment marks at a corresponding side of the substrate one group by one group.

At least one embodiment of the present disclosure provides a method for fabricating a display substrate, and the method includes: forming a first film on a substrate via a first alignment exposure process, in which step, an edge of at least one side of the substrate is formed with a plurality of groups of alignment marks in the first alignment exposure process; and forming a second film on the substrate that is formed with the first film via a second alignment exposure process which includes a plurality of mask alignment processes and a plurality of exposure processes, with an edge of at least one side of a mask that is employed in the second alignment exposure process formed with at least one group of mark structures. The distance between adjacent groups of the alignment marks at a same side of the substrate is less than or equal to a width of an effective exposure area at a corresponding side of the mask; and in the plurality of mask alignment processes, each group of the at least one group of the mark structures of the mask are aligned with groups of the alignment marks at a corresponding side of the substrate one group by one group.

BRIEF DESCRIPTION OF THE DRAWINGS

This application claims priority to and the benefit of Chinese Patent Application In order to clearly illustrate the technical solution of the embodiments of the disclosure, the drawings of the embodiments will be briefly described in the following; it is obvious that the described drawings are only related to some embodiments of the disclosure and, it is not limitative to the scope of the present disclosure.

REFERENCE MARKS

1—substrate, 11—side edge of substrate, 1—alignment mark, 3—mask, 31—mark structure, 3a—side edge of mask, 32—effective exposure area, 4—image acquisition device, 51—first film, and 52—second film.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 1:
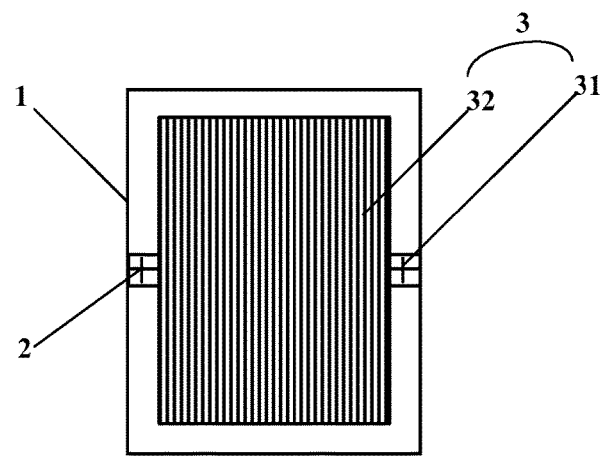
FIG. 1 is a schematic view of alignment exposure under a case that the size of a mask is matched with the size of a transparent substrate.
Figure 2:
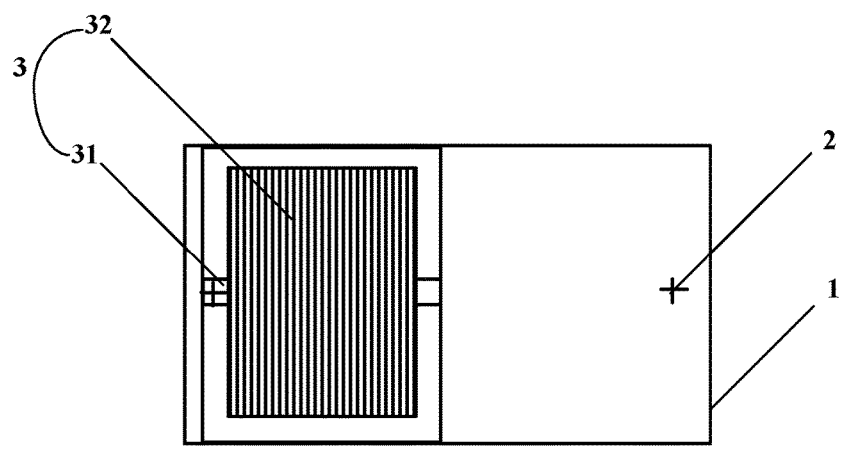
FIG. 2 is a schematic view of alignment exposure under a case that the size of a mask is less than the size of a transparent substrate.

FIG. 1 is a schematic view of alignment exposure under a condition that the size of a mask 3 is matched with the size of a substrate 1 (for example, a transparent substrate) in a fabrication process of a color filter substrate. As illustrated in FIG. 1, in a situation where the size of the mask 3 is consistent with the size of the substrate 1, mark structures 31 outside an effective exposure area 32 of the mask 3 respectively correspond to alignment marks 2 of the substrate 1, that is, the mask 3 can be properly aligned in a secondary exposure. FIG. 2 is a schematic view of alignment exposure under a condition that the size of a mask 3 is less than the size of a substrate 1 (for example, transparent substrate) in a fabrication process of a color filter substrate. As illustrated in FIG. 2, in a situation where the above method is employed to perform alignment exposure, because the size of the mask 3 is less than the size of the substrate 1, a position which a mark structure 31 of the mask 3 aligns with is in a central area of the substrate 1, and this can cause an inaccurate alignment in the secondary exposure, and then lead to that a manufacturing line of an old generation can not be used to produce a display substrate with a size larger than a size of the mask.

To further explain the alignment exposure method provided in the embodiments of the present disclosure, detailed description will be given in combination with accompanying drawings hereinafter.

The alignment exposure method, provided in the embodiment of the present disclosure, includes a first alignment exposure process (also called a first stage alignment exposure process or a primary alignment exposure process) and a second alignment exposure process (also called a second stage alignment exposure process or a secondary alignment exposure process).

Figure 3:
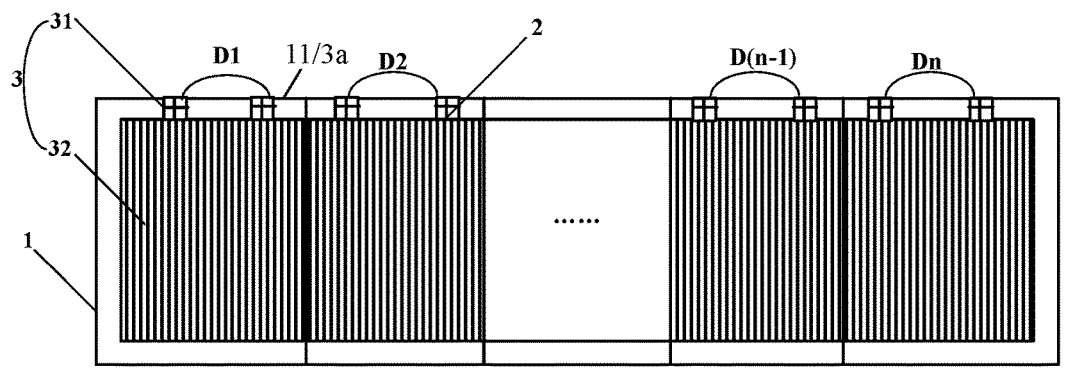
FIG. 3 is a schematic view of performing a plurality of splicing alignment exposures in a second alignment exposure process in a direction of a side of a transparent substrate in an embodiment of the present disclosure.

Referring to FIG. 3, an edge 11 of at least one side of a substrate 1 (such as a transparent substrate) is formed with a plurality of groups of alignment marks 2 in the first alignment exposure process, and each group of the alignment marks 2 includes at least two alignment marks. That is to say, the plurality of groups of the alignment marks 2 can be formed at an edge of one side of the substrate; or a plurality of alignment mark groups (each alignment mark group includes at least two alignment marks) can be formed at an edge of each side in edges of multiple sides of the substrate to form the plurality of groups of the alignment marks; or a plurality of alignment marks 2 can be formed at an edge of each side in edges of the multiple sides of the substrate and the alignment marks at the edges of the multiple sides form the plurality of groups of the alignment marks 2.

At least one group of mark structures 31 (for example, mark holes) are provided at an edge 3a of at least one side of a mask 3 employed in the second alignment exposure process. That is to say, a group of mark structures can be provided at an edge 3a of one side of the mask 3, under such a case, a plurality of groups of alignment marks can be formed at one side edge of the substrate; or a group of mark structures can also be provided at each side edge in a plurality of side edges of the mask 3, under such a case, a plurality of groups of alignment marks 2 can be formed at each side edge of the plurality of the side edges of the substrate; or a mark structure can be provided at each side edge of the plurality of the side edges of the mask and the mark structures of the plurality of the side edges form a group of mark structures, under such a case, a plurality of mark structures 2 can be formed at each side edge of the plurality of the side edges of the substrate, and the alignment marks of the plurality of the side edges form multiple groups of the alignment marks 2.

In the second alignment exposure process, a distance between two adjacent groups of alignment marks 2 at a same side (namely, at an edge position of a same side of the substrate) is less than or equal to a width of an effective exposure area 32 at a corresponding side of the mask 3 (that is, at an edge position of a corresponding side of the mask 3). That is to say, under a case that each group of two adjacent groups of the alignment marks 2, at a position of an edge of a same side of the substrate 2, includes a plurality of alignment marks that are arranged in sequence along an extension direction of the edge of the side and a last alignment mark in one group of the alignment marks is close to a first alignment mark in the other group of the alignment marks, a distance between a first alignment mark in the one group of the alignment marks and the first alignment mark in the other group of the alignment marks is less than or equal to the above width of the mask 3; or under a case that each group of two adjacent groups of the alignment marks 2 includes one alignment mark at a same side edge of the substrate, the distance between the two alignment marks, at the same side edge, of the two groups of the alignment marks is less than or equal to the above width of the mask 3.

The second alignment exposure process includes a plurality of mask alignment processes and a plurality of exposure processes, and in the plurality of the mask alignment processes, each group of the above at least one group of the mark structures 31 of the mask 3 are aligned respectively with the groups of the alignment marks 2 at a corresponding side of the substrate in sequence.

The above substrate can be a transparent substrate, under such a case, for example, the alignment exposure method provided in the embodiment of the present disclosure can be employed to fabricate a color filter substrate. Of course, the above substrate can be a non-transparent substrate as well, under such a case, the alignment exposure method provided in the embodiment of the present disclosure can be employed to fabricate a structure without transmittance requirement (for example, an OLED (organic light-emitting diode) substrate) or other structures.

For example, the above mark structure 31 can be a mark hole. Of course, the above mark structure 31 may also not be a hole structure, under such a case, for example, the position, that is formed with the mark structure 31, of the mask 3 can be made transparent, so as to realize that the mark structure is aligned with the alignment mark 2.

For example, the plurality of groups of the alignment marks 2 mentioned above can be a plurality of pairs of alignment marks and the above at least one group of the mark structures 31 can be at least a pair of mark structures. Under a case that the mark structures 31 are mark holes, for example, a plurality of pairs of the alignment marks 2 are formed at an edge of at least one side of the substrate 1 (for example, a transparent substrate) in the first alignment exposure process; a pair of mark holes is provided at an edge of at least one side of the mask 3 employed in the second alignment exposure process and a distance between two adjacent pairs of the alignment marks 2 at a same side is less than or equal to a width of an effective exposure area 32 at a corresponding side of the mask 3; and the second alignment exposure process includes a plurality of alignment processes using the mask 3 and a plurality of exposure processes, and in the plurality of the alignment processes of the mask 3, the pair of the mark holes of the mask 3 is aligned respectively with each pair of the alignment marks 2 at a corresponding side of the substrate 1 in sequence.

An edge of a side of the substrate being formed with a plurality of pairs of alignment marks 2 in the first alignment exposure process and the mark structures 31 being mark holes is now taken as an example, an illustrative embodiment of alignment operation in the second alignment exposure process mentioned above includes, for example, as below: placing a substrate 1 formed with a plurality of pairs of the alignment marks 2 under a mask 3, and after a pair of mark holes of the mask 3 is aligned with a first pair of the alignment marks 2 of the substrate 1, performing a first time alignment exposure in the second alignment exposure process; and then, moving the substrate 1 towards a set direction to allow the pair of the mark holes of the mask 3 to be aligned with a second pair of the alignment marks 2 of the substrate 1, and performing a second time alignment exposure in the second alignment exposure process; in a similar fashion, allowing the pair of the mark holes of the mask 3 to be aligned with the alignment marks 2 of a third pair, a fourth pair . . . , an nth pair, and correspondingly performing exposure of a third time, a fourth time . . . , an nth time alignment exposure in the second alignment exposure process, so as to realize secondary splicing alignment exposure in a direction of a side of the substrate 1.

In the above alignment exposure method, the size of the substrate 1 is larger than the size of the mask 3. it is known from the above technical solutions that, by employing the above alignment exposure method, without changing a manufacturing line of a low generation, an alignment exposure can be performed for a display substrate (such as a color filter substrate) with a size larger than a size of the mask 3. In addition, because the above alignment exposure method can be applied to the manufacturing line of a low generation, it is not necessary to change or update the manufacturing line of the low generation, which reduces risks involved in a changing and fabrication process, thus saves investment cost and enriches product types of display substrates fabricated.

In the above embodiments, in order to complete splicing alignment exposure, it is ensured that a distance between two adjacent pairs of the alignment marks 2 at a same side is less than or equal to a width of an effective exposure area 32 at a corresponding side of the mask 3, with a principle being as below.

Figure 4:
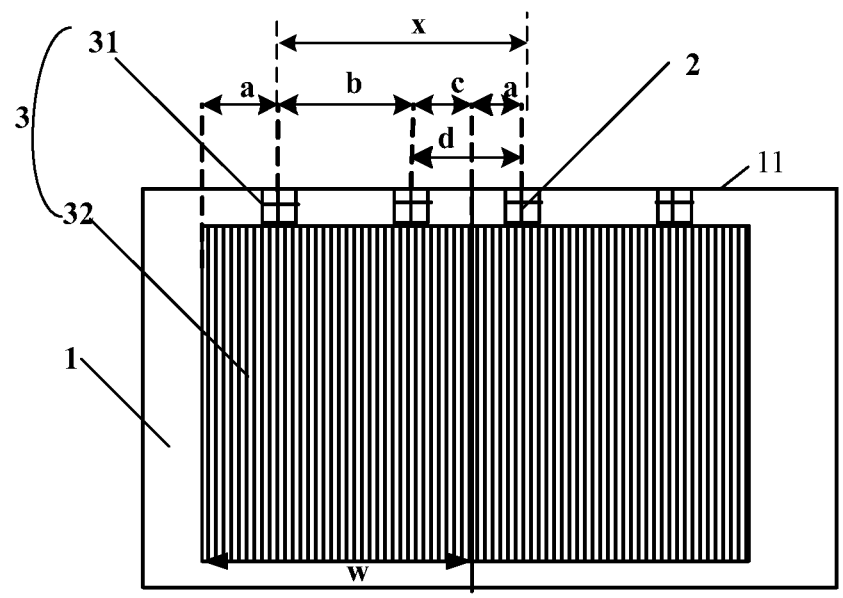
FIG. 4 is a reference schematic view for a deduction process in an embodiment of the present disclosure.

Referring to FIG. 4, the at least one group of mark structure 31 of a mask being a pair of mark holes is taken as an example, the mark holes are provided at an upper edge of an effective exposure area 32 of the mask 3, the width of the effective exposure area 32 of the mask 3 is set as w and a distance between two adjacent pairs of alignment marks 2 at a same side of a substrate 1 (such as a transparent substrate) is set as x; and under a case that the pair of the mark holes is aligned with a first pair of the alignment marks 2, a lateral distance from an edge of a left side of the effective exposure area 32 of the mask 3 to a first alignment mark 2 is set as a, a lateral distance from the first alignment mark 2 to a second alignment mark 2 is set as b, a lateral distance from the second alignment mark 2 to an edge of a right side of the effective exposure area 32 of the mask 3 is set as c and a lateral distance from the second alignment mark 2 of the first pair of the alignment marks 2 to the first alignment mark 2 of a second pair of alignment marks 2 is set as d. To ensure that no missed area exists between a first time exposure area and a second time exposure area in the plurality of the exposure processes included in the second alignment exposure processes, it is demanded that a+c≥d, so that a+b+c≥d+b, and a+b+c is the width, represented with w, of the effective exposure area 32 of the mask 3 and d+b is a distance x from the first pair of the alignment marks 2 to the second pair of the alignment marks 2, therefore, it is able to get a conclusion that the distance between two adjacent pairs of the alignment marks 2 at a same side is less than or equal to the width of the effective exposure area 32 at a corresponding side of the mask 3, that is, x≤w.

It is to be noted that patterns on the mask 3 in the context are commonly regular graphics that are arranged with repetition, so that if x<w, in order that the patterns on the mask 3 can be accurately transferred to corresponding positions of the substrate 1, in a second time exposure of exposure processes performed for two adjacent pairs of the alignment marks 2 of the substrate with the mask 3, other blocking plate can be employed to block an overlapping area of the second time exposure and a first time exposure to avoid repeated exposure for the overlapping area, as long as it can be ensured that the pattern formed in the second time exposure is connected with the pattern formed in the first time exposure to form a demanded pattern. Of course, the distance between the two adjacent pairs of the alignment marks 2 relate to the shape of the patterns on the mask 3 and the width of the effective exposure area 32 of the mask 3. In addition, in an illustrative embodiment, if w=x, that is, the distance between two adjacent pairs of the alignment marks 2 at a same side is equal to the width of the effective exposure area 32 at a corresponding side of the mask 3, the second alignment exposure process in a direction of a side of the substrate 1 can be completed under a case that times of alignment exposure are least in the second alignment exposure process.

It is mentioned that the substrate 1 in the context is usually a rectangular substrate and the mask is usually a rectangular mask 3. It is understandable that a plurality of groups of alignment marks 2 can be formed at an edge of one side of the substrate 1, or an edge of each of two sides or four sides of the substrate 1 can be formed with a plurality of groups of alignment marks 2. In the following context, examples will be given to further describe the above alignment exposure method in detail.

In a first embodiment, a plurality of groups of alignment marks 2 is formed at an edge of one side of a substrate 1 (for example, a transparent substrate). Keep on referring to FIG. 3, a plurality of groups of alignment marks 2 (for example, a plurality of pairs of alignment marks) is formed at an edge of one side of the substrate 1 in a first alignment exposure process and the plurality of groups of the alignment marks 2 at the substrate 1 are respectively marked, according to an order from left to right, a first group of the alignment marks is marked as D1, and a second group of the alignment marks 2 is marked as D2, in a similar fashion, a third group of the alignment marks 2 is marked as D3 and a third group of the alignment marks 2 is marked as D4 . . . , nth group of the alignment marks 2 is marked as Dn, and then an alignment operation in the second alignment exposure process is performed. Modes of performing alignment exposure on the substrate 1 (for example, a transparent substrate) in the above first embodiment are as below.

In a first mode of alignment exposure, a group of mark structures 31 (for example, a pair of mark holes) are provided at an edge of a corresponding side of the mask 3 employed in the second alignment exposure process; the group of the alignment structures 31 of the mask 3 are aligned with the alignment marks 2 marked as D1 of the substrate 1 (for example, a transparent substrate), and a first time alignment exposure in the plurality of mask alignment processes and the plurality of exposure processes included in the second alignment exposure process is performed; after that, the substrate 1 is moved to allow the group of the mark structures 31 of the mask 3 to be aligned with the alignment marks 2 marked as D2 of the substrate 1, and a second alignment exposure is performed; and the group of the mark structures 31 of the mask 3 are aligned with the alignment marks 2 marked as D3, D4 . . . , Dn of the substrate 1 in order, and a third time alignment exposure, a fourth time alignment exposure, . . . as well as nth time alignment exposure in the plurality of mask alignment processes and the plurality of exposure processes included in the second alignment exposure process are performed correspondingly. Thus, the group of the mark structures 31 at the mask 3 can be aligned with the alignment marks 2 at the substrate 1 in a positive direction for to perform the alignment exposures, and the second alignment exposure process of a splicing form in a direction of a side of the substrate 1 is completed correspondingly.

In a second mode of alignment exposure, keep on referring to FIG. 3, a group of mark structures (for example, a pair of mark holes) 31 are provided at an edge of a corresponding side of the mask 3 employed in the second alignment exposure process; the group of the mark structures 31 at the mask 3 are aligned with the alignment marks 2 marked as Dn at the substrate (for example, a transparent substrate) and a first time alignment exposure in the second alignment exposure process is then completed; after that, the substrate 1 is moved to align the group of the mark structures 31 with the alignment marks 2 marked as D(n-1) at the substrate 1, and a second alignment exposure is then performed; in a similar fashion, the group of the mark structures of the mask 3 are aligned with the alignment marks 2 marked as D(n-2), D(n-3) . . . D1 respectively, and a third time alignment exposure, a fourth time alignment exposure . . . nth time alignment exposure in the plurality of the mask alignment processes and the plurality of the exposure processes included in the second alignment exposure process are then performed correspondingly. Thus, the group of the alignment marks at the mask 3 can be aligned with the alignment marks 2 at the substrate 1 in a negative direction to perform the alignment exposures, so as to compete the second alignment exposure process of a splicing type in a direction of a side of the substrate 1 correspondingly.

In a third mode of alignment exposure, keep on referring to FIG. 3, a group of mark structures (for example, a pair of mark holes) 31 is provided at an edge of a corresponding side of the mask 3 employed in a second alignment exposure process; the group of the mark structures 31 at the mask 3 are aligned with the alignment marks 2 of any group at the substrate 1 (for example, a transparent substrate), such as the alignment marks 2 marked as D3, and a first time alignment exposure in the plurality of the mask alignment processes and the plurality of the exposure processes included in the second alignment exposure process is then performed; after that, the substrate 1 is moved to align the group of the mark structures 31 with the alignment marks 2 of another group at the substrate 1, for example, the alignment marks 2 marked as D(n-2), and a second time alignment exposure in the second alignment exposure process is then performed; and after that, an alignment exposure operation of aligning the mark structures with the alignment marks 2 can be repeated for the alignment marks that have not been aligned at the substrate, so that alignment exposure operation is performed for all the alignment marks 2 at the substrate 1. Thus, the mark structures 31 at the mask 3 can be aligned with the alignment marks 2 at the substrate 1 one group by one group to perform the exposure processes, and the second alignment exposure process of a splicing form in a direction of a side of the substrate 1 is completed correspondingly. Therefore, the whole second alignment exposure process is carried out more casually, and it is not necessary to be afraid of missing a group of the alignment marks 2 in the second alignment exposure process and an alignment exposure can be performed for the missed alignment marks 2 at any time in the splicing exposure process.

In the above embodiments, a splicing alignment exposure in the second alignment exposure process is realized in a direction of a side (that is, an edge position of a side) of an substrate 1 (such as a transparent substrate); and according to the above method, a splicing alignment exposure in the second alignment exposure process can be achieved in directions at two sides (that is, an edge positions at two sides) of the substrate as well.

In a second embodiment, an edge of each of first and second sides of the substrate 1 (for example, a transparent substrate) is formed with a plurality of groups of alignment marks 2 (for example, a plurality of pairs of alignment marks), and an edge of each of first and second sides, respectively corresponding to the first and second sides of the substrate 1, of the mask 3 employed in the second alignment exposure process is provided with a group of mark structures 31 (for example, a pair of mark holes). In the plurality of the mask alignment processes in the second alignment exposure process, the group of the mark structures 31 at the edge of the first side of the mask 3 are aligned with the plurality of groups of the alignment marks 2 at the edge of the first side of the substrate 1 one group by one group, and the group of the mark structures 31 at the edge of the second side of the mask 3 are aligned with the plurality of groups of alignment marks 2 at the edge of the second side of the substrate 1. In the embodiment, upon aligning a group of the mark structures 31 of the mask 3 with a plurality of groups of the alignment marks 2 in a direction of a corresponding side of the substrate 1, the alignment process can be performed in order or one after another randomly. The embodiment, on the basis that a low generation of manufacturing line is not changed, can realize exposure of the substrate 1 with a size larger than a size of the mask 3 as well, so that investment cost can be saved and risks involved in changing and manufacturing process can be reduced, which makes types of display panels more varied.

Of course, according to the operation of the above method, it is able to realize splicing alignment exposure in the second alignment exposure process in directions of four sides of the substrate 1.

In a third embodiment, an edge of each of first to four sides of the substrate 1 (for example, a transparent substrate) is formed with a plurality of groups of alignment marks 2 (for example, a plurality of pairs of alignment marks). An edge of first to four sides, respectively corresponding to the first to four sides of the substrate 1, of the mask 3 employed in the second alignment exposure process is provided with a group of mark structures 31 (for example, a pair of mark holes). In the plurality of the mask alignment processes of the second alignment exposure process, the group of the mark structures 31 at the edge of the first side of the mask 3 are aligned with the plurality of groups of the alignment marks 2 at the edge of the first side of the substrate 1 one group by one group, the group of the mark structures 31 at the edge of the second side of the mask 3 are aligned with the plurality of groups of the alignment marks 2 at the edge of the second side of the substrate 1 one group by one group, the group of the mark structures 31 at the edge of the third side of the mask 3 are aligned with the plurality of groups of the alignment marks 2 at the edge of the third side of the substrate 1 one group by one group, and the group of the mark structures 31 at the fourth side edge of the mask 3 are aligned with the plurality of groups of the alignment marks 2 at the edge of the fourth side of the substrate 1. Thus, the second alignment exposure process that achieves splicing in directions of each side of the rectangular substrate 1 is realized. Performing the second alignment exposure process to achieve splicing in directions of four sides of the substrate 1 is of same advantages as that of performing the second alignment exposure process to achieve splicing in a direction of one side of the substrate 1, and repeated descriptions are omitted herein.

It can be obtained from the above three embodiments that, according to the operations of the above method, the second alignment exposure process for splicing in direction of any side of the substrate 1 (such as a transparent substrate) can be achieved; and in order to realize the second alignment exposure process of a splicing type in direction of any side of the substrate 1, a side length of the substrate 1 can be integral multiple or non-integral multiple of the width w of the effective exposure area 32 of the mask 3. Upon the side length of the substrate 1 being non-integral multiple of the width w of the effective exposure area 32 of the mask 3, an overlapped area can exist between exposure areas of adjacent two times exposure processes, and the overlapped area between exposure areas of a second time exposure process and a first time exposure process can be blocked with other block plate in the second time exposure process of the adjacent two times exposure processes, so as to avoid repeated exposure of the overlapped area.

It is to be mentioned that, in the above three embodiments, the substrate 1 can be of a glass substrate, a quartz substrate or a heat-resisting plastic substrate. Of course, the substrate 1 can be any other substrate that is familiar to those skilled in the art, and thus detailed descriptions are omitted in the context.

Figure 5:
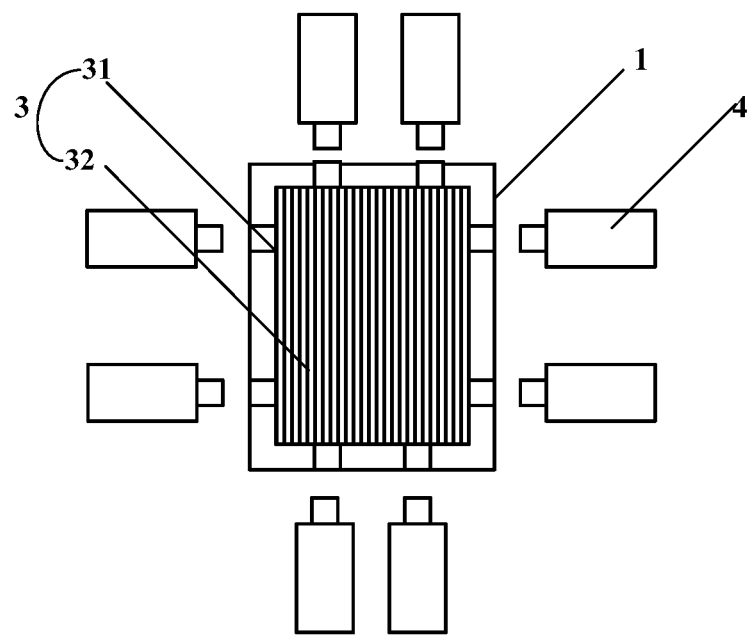
FIG. 5 is a schematic view for layout of devices in an alignment exposure in an embodiment of the present disclosure.

In order to ensure accurateness of positions of alignment exposure in the second alignment exposure process, referring to FIG. 5, based on the above embodiments, for example, the alignment exposure method provided in at least one embodiment of the present disclosure can include: detecting whether a group of mark structures 31 (for example, a pair of mark holes) at the mask 3 are aligned with a group of alignment marks 2 (for example, a pair of alignment mark) at the substrate 1 (for example, a transparent substrate) via an image acquisition device 4. In an illustrative implementation process, an operator can, via observation of an image acquired by the image acquisition device 4, judge whether the mark structures 31 and the alignment marks 2 are aligned with each other. Upon the operator detecting, via the image acquisition device 4, that the mark structures 31 to be aligned are not are aligned with the alignment marks 2, the substrate 1 can be moved manually or via a device such as a mechanical arm until the operator obtains information that the alignment marks 2 and the mark structures 31 are aligned from the image acquired via the image acquisition device 4, so as to ensure accurateness of positions of alignment exposure in the second alignment exposure process.

It is to be mentioned that, for example, the image acquisition device 4 can be assembled above mark structures 31 that are to be aligned, and it may not be provided above mark structures 31 that are not to be aligned. Upon the image acquisition device 4 being to be employed by other mark structures 31, the image acquisition device 4 can be moved to a position above the mark structures 31 to be used. In an illustrative embodiment, an image acquisition device 4 can be provided at a corresponding position above each of the mark structures 31. That is, in a situation where each of four sides of the mask 3 is formed with a group of mark structures 31, an image acquisition device 4 is provided above each of the mark structures 31, that is, eight image acquisition devices 4 are provided. By employing two image acquisition devices disposed at any side, whether the alignment marks 2 in a direction of a corresponding side of the substrate 1 are aligned with corresponding mark structures can be detected, and conversion between alignment positions in directions of any two sides of the substrate 1 can be quickly realized, without changing the position of the image acquisition device 4, so that the plurality of the mask alignment processes in the second alignment exposure process is faster and more efficient.

In the above embodiments, a plurality of image acquisition device 4 is included, therefore, in each alignment process of the mask 3 in the second alignment exposure process, at least two image acquisition device 4 detect that an alignment mark 3 is aligned with a mark structures 31 (for example, a mark hole). That is, in any alignment process in the second alignment exposure process, if two image acquisition devices 4 detect that a mark structure 31 and an alignment mark 2 are aligned, it means that the alignment is accurate. This embodiment fully ensures accurateness of each alignment position in the second alignment exposure process, so as to make patterns at the mask 3 accurately transferred to corresponding positions at the substrate 1.

Figure 6:
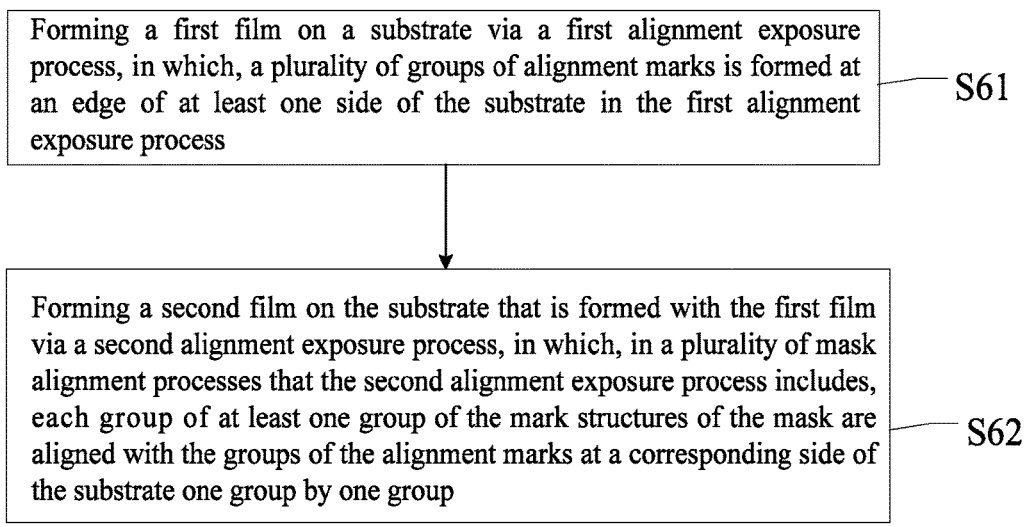
FIG. 6 is a process flow chart for a method of fabricating a display substrate in an embodiment of the present disclosure.

At least one embodiment of the present disclosure further provides a method of fabricating a display substrate. As illustrated in FIG. 6, the method includes step S61 and step S62, which will be introduced in detail hereinafter.

Step S61: forming a first film on a substrate via a first alignment exposure process. In the step, a plurality of groups of alignment marks is formed at an edge of at least one side of the substrate in the first alignment exposure process.

Step S62: forming a second film on the substrate that is formed with the first film via a second alignment exposure process. In the step, the second alignment exposure process includes a plurality of mask alignment processes and a plurality of exposure processes, and at least one group of mark structures are provided at an edge of at least one side of the mask employed in the second alignment exposure process; a distance is provided between two adjacent groups of the alignment marks at a same side of the substrate and the distance is less than or equal to a width of an effective exposure area at a corresponding side of the mask; and in the plurality of the mask alignment processes, each group of the at least one group of the mark structures of the mask are aligned with the groups of the alignment marks at a corresponding side of the substrate one group by one group.

Figure 7:
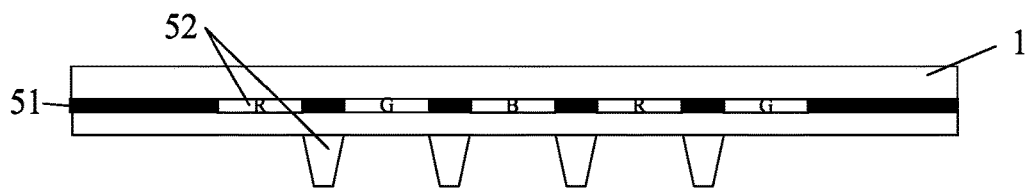
FIG. 7 is a schematic view of a display substrate fabricated by a method of fabricating a display substrate in an embodiment of the present disclosure.

For example, as illustrated in FIG. 7, the display substrate includes a first film 51 and a second film 52. For example, the display substrate fabricated with the display substrate fabrication method can be a color filter substrate, for example, the first film 51 can be a black matrix layer and the second film 52 can be a pixel layer (for example, including blue (B) pixels, green (G) pixels and red (R) pixels) and/or a spacer (for example, post spacer) layer.

In the embodiment of the present disclosure, the size of the substrate 1 is larger than the size of the mask employed in the step S62, so as to realize a splicing second alignment exposure process with the mask. As for the fabrication method of the display substrate provided in the embodiment of the present disclosure, relevant descriptions in the alignment exposure method above can be referred to, and repeated contents are omitted herein.

In the alignment exposure method and the fabrication method of a display panel provided in the embodiments of the present disclosure, n groups (namely the number of the groups is n) of alignment marks (for example, n pairs of alignment marks) are formed at an edge of at least one side of a substrate in a first alignment exposure process and at least one group of mark structures (for example, a pair of mark holes) are provided at an edge of at least one side of a mask employed in a second alignment exposure process. A distance is provided between two adjacent groups of the alignment marks at a same side of the substrate, with the distance being less than or equal to an effective exposure width at a corresponding side of the mask. In the second alignment exposure process, a group of the mark structures of the mask are usually aligned with a group of the alignment marks at a corresponding side of the substrate, and after a first time exposure in the plurality of the exposure processes included in the second alignment exposure process is completed, the group of the mark structures of the mask are aligned with another group of the alignment marks at the corresponding side of the substrate, so as to perform a second time exposure in the plurality of the exposure processes; and after that, according to the above alignment operation, each group in at least one group of the mark structures of the mask are aligned with the groups of the alignment marks at a corresponding side one group by one group, and in a similar fashion, a third time exposure, a fourth time exposure . . . an nth time exposure in the plurality of the exposure processes included in the second alignment exposure process can be performed, so that in a direction of a side of the substrate, the second alignment exposure process of multiple splicing can be completed.

It is known from the employ process as above, that, via the above alignment exposure method and the fabrication method of a display substrate, upon the size of a mask being less than the size of a substrate, the alignment exposure for the substrate with the mask can be completed as well. In addition, the alignment exposure method above can be applied to a manufacturing line of a low generation, so that it is not necessary to change or update the manufacturing line of a low generation, which reduces risks involved in a process of transformation and fabrication, saves investment cost and makes product types of display substrates that are fabricated more varied.

In the descriptions of the above embodiments, specific features, structures, materials or characteristics can be combined properly in any one or a plurality of embodiments or examples.

What are described above is related to the illustrative embodiments of the disclosure only and not limitative to the scope of the disclosure. The scopes of the disclosure are defined by the accompanying claims.

This application claims the benefit of Chinese patent application No. 201510249494.1, filed on May 15, 2015, which is incorporated by reference herein as a part of this application.

What is claimed is:

1. An alignment exposure method, comprising: a first alignment exposure process and a second alignment exposure process, wherein:
   a plurality of groups of alignment marks is formed at an edge of at least one side of a substrate in the first alignment exposure process; and
   the second alignment exposure process comprises a plurality of mask alignment processes and a plurality of exposure processes, wherein at least one group of mark structures is provided at an edge of at least one side of a mask employed in the second alignment exposure process, and a distance is provided between two adjacent groups of the alignment marks at a same side of the substrate, with the distance being less than or equal to a width of an effective exposure area at a corresponding side of the mask; and in the plurality of the mask alignment processes, each group of the at least one group of the mark structures of the mask is aligned with groups of the alignment marks at a corresponding side of the substrate one group by one group.

2. The alignment exposure method according to claim 1, wherein the plurality of groups of the alignment marks comprises a plurality of pairs of the alignment marks and the at least one group of the mark structures comprises at least one pair of the mark structures.

3. The alignment exposure method according to claim 2, further comprising:
   detecting whether a group of the mark structures of the mask is aligned with a group of the alignment marks of the substrate via an image acquisition device.

4. The alignment exposure method according to claim 1, wherein the mark structures comprise mark holes.

5. The alignment exposure method according to claim 4, further comprising:
   detecting whether a group of the mark structures of the mask is aligned with a group of the alignment marks of the substrate via an image acquisition device.

6. The alignment exposure method according to claim 1, wherein the substrate is a transparent substrate.

7. The alignment exposure method according to claim 6, further comprising:
   detecting whether a group of the mark structures of the mask is aligned with a group of the alignment marks of the substrate via an image acquisition device.

8. The alignment exposure method according to claim 1, wherein the plurality of groups of the alignment marks is formed at an edge of one side of the substrate in the first alignment exposure process and one group of the mark structures is provided at an edge of one corresponding side of the mask employed in the second alignment exposure process; and in the plurality of the mask alignment processes in the second alignment exposure process, the one group of the mark structures of the mask is aligned with a first group of the alignment marks at the one side of the substrate, and after a first time exposure in the plurality of the exposure processes is completed, the one group of the mark structures of the mask is aligned with a second group of the alignment marks at the substrate; and in a similar fashion, the one group of the mark structures of the mask is aligned with the plurality of groups of the alignment marks at the edge of the one side of the substrate in sequence.

9. The alignment exposure method according to claim 8, further comprising:
   detecting whether a group of the mark structures of the mask is aligned with a group of the alignment marks of the substrate via an image acquisition device.

10. The alignment exposure method according to claim 1, wherein in the first alignment exposure process, an edge of each of first and second sides of the substrate is formed with a plurality of groups of the alignment marks, and an edge of each of first and second sides, respectively corresponding to the first and second sides of the substrate, of the mask employed in the second alignment exposure process is provided with a group of the mark structures; and
   in the plurality of the mask alignment processes of the second alignment exposure process, the group of the mark structures at the edge of the first side of the mask is aligned with the plurality of groups of the alignment marks at the edge of the first side of the substrate one group by one group, and the group of the mark structures at the edge of the second side of the mask is aligned with the plurality of groups of the alignment marks at the edge of the second side of the substrate one group by one group.

11. The alignment exposure method according to claim 10, further comprising:
   detecting whether a group of the mark structures of the mask is aligned with a group of the alignment marks of the substrate via an image acquisition device.

12. The alignment exposure method according to claim 1, wherein in the first alignment exposure process, an edge of each of first to fourth sides of the substrate is formed with a plurality of groups of the alignment marks and an edge of each of first to fourth sides, respectively corresponding to the first to fourth sides of the substrate, of the mask employed in the second alignment exposure process is formed with a group of the mark structures; and
   in the plurality of the mask alignment processes of the second alignment exposure process, the group of the mark structures at the edge of the first side of the mask is aligned with the plurality of groups of the alignment marks at the edge of the first side of the substrate one group by one group, the group of the mark structures at the edge of the second side of the mask is aligned with the plurality of groups of the alignment marks at the edge of the second side of the substrate one group by one group, the group of the mark structures at the edge of the third side of the mask is aligned with the plurality of groups of the alignment marks at the edge of the third side of the substrate one group by one group, and the group of the mark structures at the edge of the fourth side of the mask is aligned with the plurality of groups of the alignment marks at the edge of the fourth side of the substrate one group by one group.

13. The alignment exposure method according to claim 12, further comprising:
   detecting whether a group of the mark structures of the mask is aligned with a group of the alignment marks of the substrate via an image acquisition device.

14. The alignment exposure method according to claim 1, further comprising:
   detecting whether a group of the mark structures of the mask is aligned with a group of the alignment marks of the substrate via an image acquisition device.

15. The alignment exposure method according to claim 14, wherein one image acquisition device is provided on each of the mark structures correspondingly.

16. The alignment exposure method according to claim 15, wherein in a mask alignment process of the second alignment exposure process, at least two image acquisition devices detect that an alignment mark is aligned with a mark structure.

17. The alignment exposure method according to claim 1, wherein a size of the substrate is larger than a size of the mask.

18. A method for fabricating a display substrate, comprising:
   forming a first film on a substrate via a first alignment exposure process, wherein a plurality of groups of alignment marks is provided at an edge of at least one side of the substrate in the first alignment exposure process; and
   forming a second film on the substrate that is formed with the first film via a second alignment exposure process, wherein the second alignment exposure process comprises a plurality of mask alignment processes and a plurality of exposure processes, at least one group of mark structures is provided at an edge of at least one side of the mask employed in the second alignment exposure process, and a distance is provided between two adjacent groups of the alignment marks at a same side of the substrate, with the distance being less than or equal to a width of an effective exposure area at a corresponding side of the mask; and in the plurality of the mask alignment processes, each group in the at least one group of the mark structures of the mask is aligned with groups of the alignment marks at a corresponding side of the substrate one group by one group.

19. The method for fabricating a display substrate according to claim 18, wherein a size of the substrate is larger than a size of the mask.

20. An alignment exposure method, comprising: a first alignment exposure process and a second alignment exposure process, wherein:
   in the first alignment exposure process, a plurality of groups of alignment marks is formed at an edge of at least one side of a substrate and a black matrix layer is formed on the substrate; and
   the second alignment exposure process comprises a plurality of mask alignment processes and a plurality of exposure processes, wherein at least one group of mark structures is provided at an edge of at least one side of a mask employed in the second alignment exposure process, and a distance is provided between two adjacent groups of the alignment marks at a same side of the substrate, with the distance being less than or equal to a width of an effective exposure area at a corresponding side of the mask; and in the plurality of the mask alignment processes, each group of the at least one group of the mark structures of the mask is aligned with groups of the alignment marks at a corresponding side of the substrate one group by one group.

\* \* \* \* \*